United States Patent [19]

Fitzpatrick

[11] Patent Number: 4,632,588

[45] Date of Patent: Dec. 30, 1986

[54] LATCHING LEVER FOR PRINTED CIRCUIT BOARDS

[75] Inventor: Michael H. Fitzpatrick, Sunnyvale, Calif.

[73] Assignee: Northern Telecom Limited, Montreal, Canada

[21] Appl. No.: 701,228

[22] Filed: Feb. 13, 1985

[51] Int. Cl.[4] .......................... B25G 3/00; F16D 1/00
[52] U.S. Cl. ...................................... 403/16; 361/415; 361/399; 403/321
[58] Field of Search ................. 361/415, 399; 403/16, 403/321

[56] References Cited

U.S. PATENT DOCUMENTS

| | | | |
|---|---|---|---|
| 4,064,551 | 12/1977 | Lightfoot | 361/399 |
| 4,233,646 | 11/1980 | Leung et al. | |
| 4,313,150 | 1/1982 | Chu | 361/415 X |
| 4,530,615 | 7/1985 | Katsuura et al. | 403/16 |

*Primary Examiner*—Andrew V. Kundrat
*Attorney, Agent, or Firm*—Schwartz, Jeffery, Schwaab, Mack, Blumenthal & Evans

[57] ABSTRACT

A latching lever for use with a printed circuit board and being of a width similar to that of a faceplate for the PCB, includes an actuating member and a hooked portion projecting therefrom. The actuating member is flexibly hinged to a body portion of the latching lever by a hinge formation which includes a thick section located in a plane of the hooked portion for defining a preferred resilience of the hinge, and a thinner section away from the thick section for stabilizing the actuating member in relation to the body portion. A stud carried by the PCB is engaged by the hooked portion to latch the lever. The hooked portion is disengaged from the stud by moving the actuating member thereby freeing the lever to rotate about its pivot point. A portion of the body remote from the actuating member and extending beyond the pivot point includes a stop formation for contacting an edge of the PCB to prevent unnecessarily extreme rotation.

8 Claims, 10 Drawing Figures

LATCHING LEVER FOR PRINTED CIRCUIT BOARDS

The invention relates generally to devices for aiding the insertion into, the removal from, and the retention in, of objects relative to a mating piece of apparatus, and more particularly to a device for use with printed circuit boards (PCBs) for aiding their insertion into, removal from, and retention in, a holder for PCBs.

BACKGROUND OF THE INVENTION

Printed circuit boards (PCBs) are generally mounted in frames, with a large number of PCBs mounted in each frame, with as high a density as possible, in order to save space. A typical PCB comprises a pattern of electrical interconnections on a flat rectangular sheet of insulating material (such as glass-fiber reinforced resin) and carries a number of components on one of its flat faces. The four edges of the PCB can be referred to as a front edge, a back (or rear) edge, a top edge, and a bottom edge. The PCB slides into guide channels in the frame, the PCBs lying normally in a vertical plane with the top edge in a top guide channel, the bottom edge in a bottom guide channel, and the rear edge carrying a set of connections which mate with a corresponding set of connections mounted to the frame. The front edge of the PCB may carry two devices (one usually near the top, and one usually near the bottom) to aid in inserting, removing or retaining the PCB relative to the frame.

An example of a prior art device for performing this function is disclosed in U.S. Pat. No. 4,233,646 entitled "Latching Lever for Printed Circuit Boards" which issued to E. C. Leung and I. R. Revah on Nov. 11, 1980. The disclosed latching lever includes a latching mechanism which comprises a hooked portion flexibly connected to the body portion of the latching lever, an actuating member solidly connected to the hooked portion for moving the hooked portion relative to the body portion, and a stop portion, solidly connected to the body portion for limiting the movement of the actuating member. A stud carried by the PCB is engaged by the hooked portion of the lever to enable the lever to latch. Moving the actuating member disengages the hooked portion from the stud, thereby unlatching the lever, and leaving the lever free to pivot about its pivot point.

Such latching levers are commonly used in combination with PCBs having various widths of faceplates with accommodation for the lever being provided by a cutout in the end of the faceplate.

One such prior art latching lever 10 is illustrated in FIG. 1 of the accompanying drawings wherein the latching lever 10 and a corresponding PCB faceplate 8 are depicted in combination at an upper front corner of a PCB. The faceplate 8 includes an extension 9 which defines a cutout being occupied by the latching lever 10. The latching lever 10 includes a body portion 11, actuation member 12, and an arm portion 13 which is bifurcated in order to straddle the PCB (not shown). Operation of the latching lever is well known but is briefly reviewed here. In the latched position shown, a hooked portion not visible is held by a stud in the PCB so that the arm portion engages a U-shaped channel or the like formation in a mating apparatus (not shown) and so secures the PCB in the mating apparatus. Movement of the actuation member releases the hooked portion whereafter movement of the latching lever aids in removal of the PCB from the mating apparatus. The necessity of the cutout requires that the end portion of the faceplate be projected beyond any mounting point between the faceplate and the associated circuit board. Therefore the faceplate is typically fabricated from a robust material, or a material which is not likely to suffer damage if subjected to mishandling such as accidental droppage.

A faceplate of lighter, less costly and less robust material is useful in an arrangement wherein the latching lever is of the same width as the faceplate. Such a latching lever is of a structure similar to that depicted in the previously mentioned patent but is modified to occupy that area previously occupied by the end projection of the faceplate. However widening of the latching lever required a wider hinge area over which the latching and unlatching stresses are transmitted. The larger area presented undesirable resistance to operation of the lever. A reduction of thickness of the hinge web reduced the resistance to operation but rendered the hinge failure-prone in the area of the hooked portion due to stress concentration.

Another problem with the latching lever of the previously mentioned patent is that its operation can be confusing to an uninitiated person. The confusion can result when the latching lever is in an extreme open position in the case where the circuit board is being inserted into a mating apparatus. In this case a portion of the body of the latching lever can contact the mating apparatus in the extreme position thus complicating normal circuit board insertion. The uninitiated person in frustration may deal a substantial wack with the heel of their hand to the faceplate. Such treatment tends to be damaging particularly to the cost reduced less robust faceplate.

SUMMARY OF THE INVENTION

The problem of hinge resilience and reliability is satisfied by use of a hinge having a first section of preferred resilience near the hook portion of the latching lever and a second much thinner and very flexible section remote from the hooked portion.

The problem of confusion during insertion is obviated by combining a stop formation with an arm of the latching lever near the pivot point such that extreme rotation about the pivot point is limited by the stop formation being in abutting contact with an edge of the circuit board.

Stated in other terms the invention is a latching lever for use with an object for aiding entry of the object into a mating apparatus, for securing the object in the mating apparatus, and for aiding the removal of the object from the mating apparatus. The latching lever includes a body portion for pivotable connection with the object about a pivot point, an actuation member which is connected by a resilient hinge to the body portion remote from the pivot point and a hooked portion for engaging a projection attached to the object, which is solidly connected to and protrudes from the actuation member. Movement of the actuation member relative to the body portion causes the hooked portion to disengage from the projection. The latching lever is characterized in that the resilient hinge includes a first thick web section of preferred resilience adjacent the hooked portion and a second thin web section of greater flexibility than the first section remote from the hooked portion, the first section determining the resilience of the hinge and the second section coacting with the first section to stabilize the actuation member.

A latching lever for use with a sheet material circuit board also includes an arm portion protruding away from the body portion close to the pivot point for engaging said mating apparatus. The latching lever is characterized by a stop formation in the arm portion, the stop formation being defined by a bottom of a groove extending through the arm portion, through the pivot point in the body portion and through the hooked portion. In combination with the board, the pivot point straddles the sheet material. When the lever is in an extreme unlatched position the arm also straddles the sheet material with the bottom of the groove abutting an edge of the sheet material to define the extreme unlatched position.

In one example the latching lever is further characterized in that the side walls of the groove are tapered inwardly in a direction away from the bottom of the groove close to the pivot point such that in combination with the board the side walls are stressed outwardly by the sheet material and impart frictional resistance to movement of the latching lever. The frictional resistance helps to maintain a preferred position of an upper latching lever during initial stages of entry.

BRIEF DESCRIPTION OF THE DRAWINGS

An example embodiment is discussed with reference to the accompanying drawings in which.

DETAILED DESCRIPTION

Figure 1:
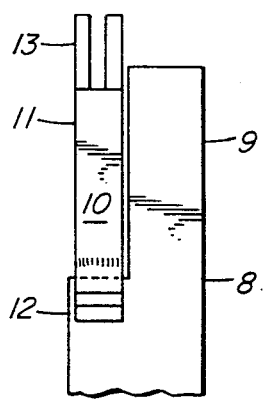
FIG. 1 is a front view of the previously introduced prior art latching lever in combination with the corresponding printed circuit board faceplate.
Figure 2:
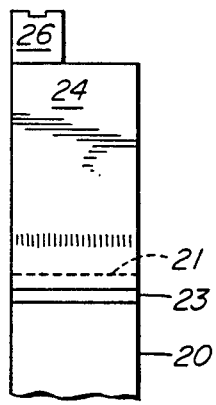
FIG. 2 is a front view of a latching lever in accordance with the invention in combination with a printed circuit board faceplate.

The latching lever depicted in FIGS. 2 to 6 is in contrast to the prior art latching lever of FIG. 1 and is particularly illustrated in FIG. 2. Referring to FIGS. 1 and 2, a faceplate 20 terminates at an upper edge 21. As the latching lever at 24 extends across the width of the PCB faceplate there is no need for an extension to the faceplate similar to the extension 9 in FIG. 1. The latching lever and faceplate combination in FIG. 2 permit a more secure fastening of the faceplate 20 to the PCB and permit the faceplate to be fabricated from a less robust material than is typically required for the faceplate 8 in FIG. 1.

Figure 3:
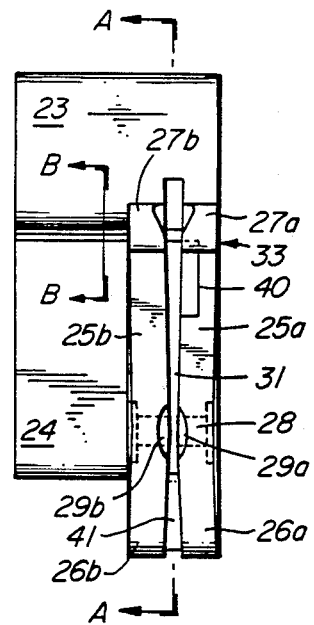
FIG. 3 is an enlarged plan view of a back side of the latching lever in FIG. 2.
Figure 4:
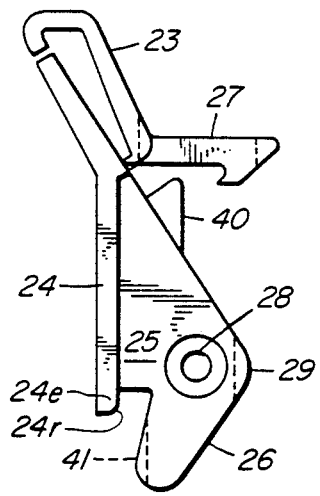
FIG. 4 is a left side view of the latching lever in FIG. 3.
Figures 5, 6:
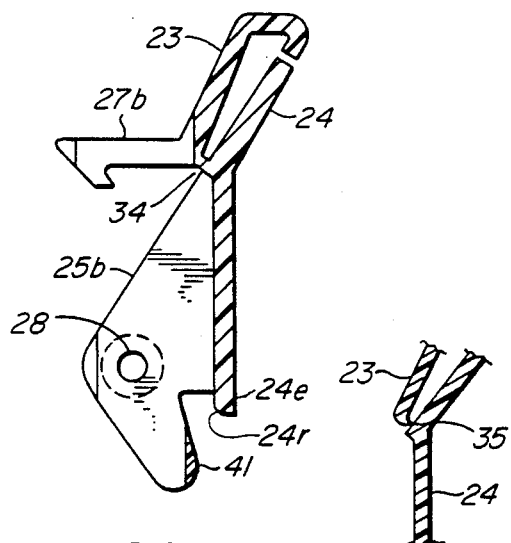
FIG. 5 is a sectional view of the latching lever taken along a line AA in FIG. 3.
FIG. 6 illustrates a hinge web section and is a sectional view of part of the latching lever taken along a line BB in FIG. 3.

Referring to FIGS. 3, 4 and 5, the latching lever includes a body portion 24, the face of which is normally visible to an observer when the latching lever is in a latched position. A pivot aperture 28 is defined in an arm 25 which projects from the rear of the body portion 24 toward one side thereof and is bifurcated into arm portions 25a and 25b by a groove 31. An actuation member 23 is flexibly attached to the body portion 24 by a resilient hinge formation at 33. A hooked portion 27 rigidly projects from the actuation member 23 and is likewise bifurcated into portions 27a and 27b by the groove 31. A stop formation 40 projects from the arm 25, in this example the arm portion 25a. A lever ar 26 extends from the arm 25 on a side of the aperture 28 remote from the actuation member 23. The lever arm 26 is divided into portions 26a and 26b by the groove 31 but only partially so as a joining web 41 joins the portions 26a and 26b and defines a bottom portion of the groove 31. The joining web 41 also provides a stop formation which limits rotation of the latching lever when in the unlatched position by abutting an edge of a PCB sheet material to which the latching lever is normally fastened by way of the pivot aperture 28.

Sidewalls provided by surfaces of the arm portions 25a and 25b are tapered slightly inwardly so that in an unassembled state the narrowest width defined by the groove 31 is slightly less than the thickness of the PCB sheet material. When assembled, the PCB sheet material therefore stresses the portions 25a and 25b with the result that some additional friction to pivotal movement provides an improved ergonomically pleasing latching or unlatching function and helps to maintain a preferred position of the latching lever during initial stages of entry. Outwardly chamfered relief surfaces 29a and 29b aid in alignment of the groove 31 with the sheet material for ease of assembly. The hinge at 33 includes a thick hinge section 34 (see FIG. 5) and a thinner hinge section 35 (see FIG. 6). The thick hinge section 34 is of a predetermined resilience and joins the actuation member 23 and the body portion 24 in an area close to the hooked portion 27. The thick hinge section 34 transmits the primary stresses of operating the actuation member to unlatch the hooked portion 27. The thinner hinge section 35 in this example is of extreme thinness so as to have no material effect upon the perceivable resilience of the hinge. The thin section 35 in operation acts to stabilize the actuation member 23 and thus minimize torqueing force which would otherwise be applied along an axis normal to the intended axis of rotation between the actuation member 23 and the body portion 24.

Figure 7:
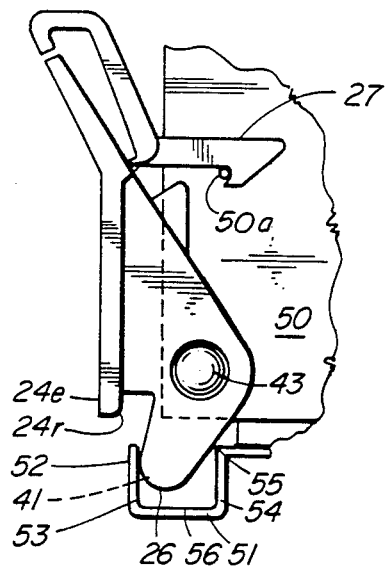
FIG. 7 is a view of the latching lever, similar to that illustrated in FIG. 4 and in combination with a sheet material circuit board and a portion of the mating apparatus, showing a latched position for securing the circuit board.

Referring to FIG. 7 the latching lever is shown fastened by a rivet 43 to a corner between lower and front edges of a PCB 50. The hooked portion 27 is in latched engagement with a stud 50a fixed in the PCB 50. Part of the mating apparatus includes a U-shaped channel 51 having front, outer and inner surfaces 52 and 53, and a rear inner surface 54 which terminates at a corner formation 55. All of these elements 52–55 interact with the latching in the normal course of its use, in a manner similar to that depicted in the FIGS. 7–10. For example in FIG. 7, an outer surface of the arm 26 is adjacent the corner formation while the tip of the arm 26 near the stop formation 41 is adjacent the front inner surface 53.

Figure 8:
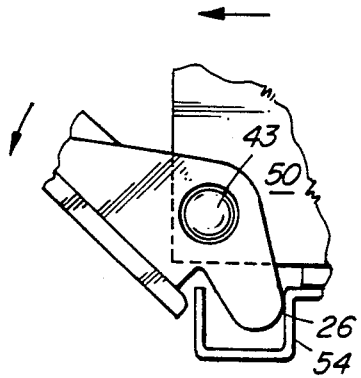
FIG. 8 is a view of the latching lever similar to that in FIG. 7, showing a position of the latching lever for aiding removal of the circuit board.
Figure 9:
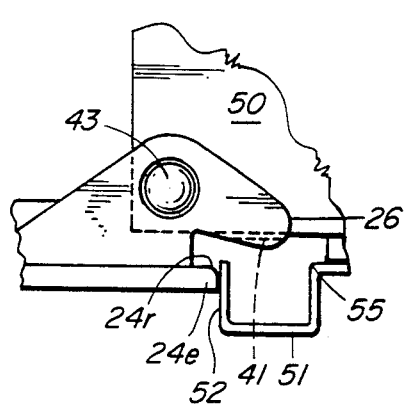
FIG. 9 is a view of the latching lever similar to that in FIG. 7 and showing an extreme unlatched position of the latching lever just prior to aiding entry of the circuit board.
Figure 10:
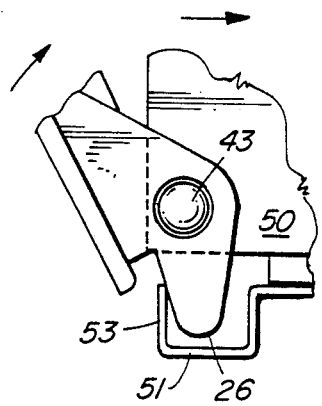
FIG. 10 is a view of the latching lever similar to that in FIG. 7 and showing a position of the latching lever for aiding entry of the circuit board into the mating apparatus.

In this position the PCB is restrained in the mating apparatus by the channel 51 in juxtapositon with the arm 26 permitting little or no slack. When the hooked portion 27 is disengaged the lever is rotated in a counter-clockwise direction as shown in FIG. 8. The PCB 50 is partially removed from the mating apparatus being thus urged by the tip of the arm 26 bearing against the rear inner surface 54. Continued rotation finally brings the stop formation 41 into contact with the lower edge of the PCB 50 and at the same time completes effective removal of the PCB 50 by means of an extension 24e bearing against the front outer surface 52. As illustrated in FIGS. 4 and 5, and 7-10, the extension 24e projects from the body portion 24. The extension 24e includes a curved surface 24r such that when the extension 24e is in contact with the front outer surface 52 the effect of the curved surface 24r is that of distributing the bearing force on the surface 52 and thus reduces scuffing of the surface 52. Moving the lever in the clockwise direction as illustrated in FIG. 10 aids entry of the PCB 50 into the mating apparatus. In this case the entry is urged by the surface of the arm 26 near the stop formation 41 bearing against an extreme upper end of the surface 53. Continued rotation eventually moves the lever to the latched position previously discussed with reference to FIG. 7.

A latching lever as defined in the claims herein may be formed from various plastic materials readily selectable by persons skilled in the molding crafts, exemplary materials being polypropylene or nylon.

What is claimed is:

1. A latching lever for use with an object for aiding the entry of said object into a mating apparatus, for securing said object in said mating apparatus, and for aiding the removal of said object from said mating apparatus, the latching lever including a body portion for pivotal connection to said object, about a pivot point, an actuation member being connected by a resilient hinge to the body portion remote from the pivot point and a hooked portion solidly connected to and protruding from the actuation member for engaging a projection attached to said object, the actuation member being for moving the hooked portion relative to the body portion so as to selectively disengage said hooked portion from said projection, the latching lever being characterized in that the resilient hinge comprises:
   a first section near the hooked portion and a second section being thinner and more flexible than the first section.

2. A latching lever as defined in claim 1 further characterized by a stop formation carried by the body remote from the resilient hinge beyond the pivot point for preventing extreme and unnecessary rotation of the lever about the pivot point.

3. A latching lever for use with a sheet material circuit board having a faceplate if predetermined width, for aiding entry of said board into a mating apparatus, for securing said board in said mating apparatus, and for aiding the removal of said board from said mating apparatus, the latching lever including a body portion for pivotal connection to said circuit board, about a pivot point, an actuation member being connected by a resilient hinge to the body portion remote from the pivot point and a hooked portion solidly connected to and protruding from the actuation member for engaging a projection attached to said circuit board, the actuation member being for moving the hooked portion relative to the body portion so as to selectively disengage said hooked portion from said projection, the latching lever being characterized in that the actuation member and the body portion are of a width similar to that of said faceplate and in that the resilient hinge comprises a short thick section in a plane of the hooked portion for defining a preferred resilient and a longer thinner section extending from the thick section for stabilizing the actuation lever.

4. A latching lever as defined in claim 3 further characterized by a stop formation carried by the body remote from the resilient hinge beyond the pivot point for preventing extreme and unnecessary rotation of the lever about its pivot point.

5. A latching lever as defined in claim 3 in which an arm portion protrudes from said body portion, close to said pivot point, for engaging said mating apparatus during entry thereinto, for aiding said entry, and for blocking the removal of said circuit board until said lever is pivoted to an alternate position, the latching lever being further characterized by a stop formation protruding from the arm portion and positioned to abut against an edge of said circuit board thereby defining an extreme limit of the alternate position.

6. A latching lever for use with a sheet material circuit board, for aiding entry of said board into a mating apparatus, for securing said board in said mating apparatus, and for aiding the removal of said board from said mating apparatus, the latching lever including a body portion having a pivot point at one end thereof, a hooked portion for releasably engaging a stud in the board, the hooked portion extending from an actuation member, the actuation member being resiliently hinged to the body portion remote from the pivot point, an arm portion protruding away from the body portion close to the pivot point for engaging said mating apparatus, a groove extending through the arm portion, through the pivot point in the body portion and through the hooked portion whereby in combination with the board the pivot point straddles the sheet material, the latching lever being characterized in that side walls of the groove are tapered inwardly in a direction away from a bottom of the groove whereby when assembled in combination iwth the board, the side walls are stressed outwardly by the sheet material.

7. A latching lever for use in combination with a printed circuit board including a sheet material circuit board and a faceplate of predetermined width, the latching lever being for aiding entry of said board into a mating apparatus, for securing said board in said mating apparatus and for aiding in the removal of said board from said mating apparatus, the latching lever including an elongated body portion having a piivot point, a hooked portion for releasably engaging a stud in the board, the hooked portion extending from an actuation member, the actuation member being flexibly joined by a resilient hinge to the elongated body portion at a position remote from the pivot point, an arm portion protruding from the elongated body portion close to the pivot point for engaging said mating apparatus, the latching lever being characterized in that,
   a front face of the elongated body portion extends laterally to be of a width similar to the width of the faceplate;
   the actuation member is of a similar width; and
   the resilient hinge extends across said width and includes a first section near the hooked portion and a second section being thinner and more flexible than the first section.

8. A latching lever as defined in claim 7 wherein the first section and the second section provide a continuous web across said width.

* * * * *